(12) United States Patent
Fluhrer

(10) Patent No.: US 8,922,979 B2
(45) Date of Patent: Dec. 30, 2014

(54) OPERATING UNIT FOR AN ELECTRICAL DEVICE

(75) Inventor: Henry Fluhrer, Bretten (DE)

(73) Assignee: E.G.O. Elektro-Geratebau GmbH, Oberderdingen (DE)

( * ) Notice: Subject to any disclaimer, the term of this patent is extended or adjusted under 35 U.S.C. 154(b) by 368 days.

(21) Appl. No.: 13/336,689

(22) Filed: Dec. 23, 2011

(65) Prior Publication Data

US 2012/0106051 A1 May 3, 2012

Related U.S. Application Data

(63) Continuation of application No. PCT/EP2010/059652, filed on Jul. 6, 2010.

(51) Int. Cl.
| | | |
|---|---|---|
| *H05K 5/00* | (2006.01) | |
| *H05K 7/00* | (2006.01) | |
| *H03K 17/96* | (2006.01) | |

(52) U.S. Cl.
CPC .... *H03K 17/964* (2013.01); *H03K 2217/96015* (2013.01); *H03K 2217/96042* (2013.01)
USPC .................................................. 361/679.01

(58) Field of Classification Search
USPC ................. 200/600, 46, 5 R, 5 A, 292, 243; 361/679.01
See application file for complete search history.

(56) References Cited

U.S. PATENT DOCUMENTS

| | | | |
|---|---|---|---|
| 5,636,729 A | 6/1997 | Wiciel | |
| 6,403,904 B1 | 6/2002 | Schilling | |
| 7,525,063 B2 | 4/2009 | Dorwarth et al. | |
| 2002/0144886 A1* | 10/2002 | Engelmann et al. | 200/600 |
| 2004/0075360 A1 | 4/2004 | Stadelmann | |
| 2007/0023262 A1* | 2/2007 | Liu et al. | 200/5 R |
| 2007/0229319 A1 | 10/2007 | Raisanen | |
| 2009/0159417 A1* | 6/2009 | Lin et al. | 200/600 |
| 2010/0007531 A1 | 1/2010 | Fluhrer | |

FOREIGN PATENT DOCUMENTS

| | | |
|---|---|---|
| DE | 195 28 821 A1 | 2/1997 |
| DE | 197 12 137 A1 | 9/1998 |
| DE | 103 61 350 A1 | 7/2005 |
| DE | 10 2004 022 946 B2 | 5/2007 |
| DE | 10 2007 006 506 A1 | 8/2008 |
| DE | 10 2007 013 078 A1 | 9/2008 |

(Continued)

OTHER PUBLICATIONS

International Preliminary Report on Patentability dated Jan. 17, 2012 in PCT/EP2010/059652.

(Continued)

*Primary Examiner* — Edwin A. Leon
*Assistant Examiner* — Anthony R. Jimenez
(74) *Attorney, Agent, or Firm* — Lee & Hayes, PLLC

(57) ABSTRACT

An operator control device for an electrical appliance, such as an extractor hood, has an operator control panel, an illuminated display and a contact switch together with a planar, pressure-sensitive piezo sensor element. The operator control panel has at least one opening covered by a transparent window. A flat component support is arranged on the rear face of the operator control panel, the component support having LEDs on a front face, which faces the operator control panel. The component support is fitted with the sensor element together with the sensor support on the other rear face in the region of the opening.

22 Claims, 3 Drawing Sheets

(56) References Cited

FOREIGN PATENT DOCUMENTS

| EP | 335 838 A2 | 3/1989 |
| JP | 2006-059565 | 3/2006 |
| JP | 2006-126735 | 5/2006 |
| WO | WO 2011/003912 | 1/2011 |

OTHER PUBLICATIONS

German Search Report dated Feb. 25, 2010 for DE 10 2009 033 538.2-34.
European Search Report dated Mar. 29, 1989 for EP89810234.
Japanese Office Action dated Nov. 19, 2013 in 2012-518970.

* cited by examiner

OPERATING UNIT FOR AN ELECTRICAL DEVICE

CROSS REFERENCE TO RELATED APPLICATIONS

This application is a continuation of PCT application PCT/EP2010/059652, filed on Jul. 6, 2010, which in turn claims priority to DE 10 2009 033 538.2, filed on Jul. 9, 2009, the contents of both of which are incorporated by reference for all that they teach.

FIELD OF APPLICATION

The invention relates to an operator control device or an operating unit for an electrical appliance, for example, an extractor hood and a cooking appliance or any other large appliance from among the group that are known as "white goods."

BACKGROUND

In the case of stainless-steel extractor hoods, it is known, for example, in particular from U.S. patent publication 2010-0007531, to arrange pressure-sensitive touch switches, for example with piezo sensor elements, behind an operator control panel.

It is also known to form illuminated displays and capacitive touch switches beneath glass-ceramic hobs, see U.S. Pat. No. 6,403,904, for example. In this case, use is made of the fact that a glass-ceramic hob plate is transparent to illuminated displays, which are arranged beneath it.

It is within this context that the present disclosure is provided.

SUMMARY

Embodiments herein address the problem of providing an operator control device of the kind cited in the Background section and an electrical appliance which is provided with the operator control device, with which operator control device and electrical appliance avoids the problems of the prior art and, in particular, an illuminated display and a pressure-sensitive sensor element can be jointly used.

This problem is addressed in one embodiment by an operator control device having the features as claimed herein. Advantageous and preferred embodiments are the subject matter of the further claims and will be explained in greater detail in the text, which follows. The wording of the claims is included in the content of the description by express reference.

The operator control device has an illuminated display and a pressure-sensitive contact switch, with the contact switch having a flat pressure-sensitive sensor element. According to one embodiment disclosed herein, the operator control panel has at least one opening, which is covered by a transparent window or into which the transparent window is inserted. A flat component support is arranged on the rear face of the operator control panel, the component support having a source of illumination on a front face, which faces the operator control panel. The component support has at least the planar pressure-sensitive sensor element on the other rear face thereof, specifically in the region of the at least one opening, or such that it is situated opposite the opening. Therefore, it is possible for the illumination source of the component support to emit light through the openings or the transparent window and therefore also to be able to be identified even if an operator control panel is otherwise opaque, in particular in the form of an illuminated display. The sensor element in the region of the openings, that is to say in the region of the illuminated display, can be used to enable an operator to apply a certain amount of pressure to the illuminated display using his finger in order to trigger a switching process as a result of his touch being identified. As a result, it is therefore possible for an illuminated display to display a corresponding operator control function to an operator. It is also possible for this operator control function to be instinctively triggered by a finger being applied. As an alternative, a relatively high number of functions, such as firstly an illuminated display and secondly a touch switch, can therefore be integrated, so that the operator control device does not take up an excessive amount of space on the electrical appliance.

In another embodiment disclosed herein, a plurality of openings are provided in the operator control panel, the openings belonging, in particular, to a single touch switch or a single illuminated display. These openings can be separated from one another by thin webs, in particular material webs of the operator control panel. As a result, they can form, for example, a seven segment display for displaying individual numbers, for example for displaying power levels.

Provision can be made for the illumination source to be arranged directly behind the openings in the operator control panel for the purpose of better transmission of light into and through the openings. Under certain circumstances, the illumination source can even project some way into the openings, this not only improving the illumination effect but also allowing the relatively flat application of the component support, which is fitted with the illumination means, to the rear face of the operator control panel. Furthermore, this provides a simple way of preventing light from one illumination source into one opening or behind one opening being emitted to another opening or into another opening.

Provision is advantageously made, in the case of a proximity sensor having an illumination display, for a planar sensor element to have at least one or two associated openings in the operator control panel or to be situated opposite the openings. This therefore means, as it were, that the surface of the sensor element covers these openings even if the two do not lie directly on the other, but are separated from one another at least by the component support. This advantageously applies to all the openings in a coherent symbol or a coherent illuminated display, for example the seven segment display.

In another embodiment, it is possible to form the sensor element to be planar and apply the sensor element to the component support as a piezoceramic or piezosensitive coating. A coating of this kind can be composed of an appropriate piezoceramic material.

In an alternative embodiment, a planar sensor element can be applied to the component support in the form of a separate component, advantageously with a sensor support. The sensor element can be, for example, a thin piezoceramic, advantageously in the form of a plate, which can be adhesively bonded to the component support, or mechanically fastened to the component support in some other way, in particular together with the sensor support. Explicit reference is also made to U.S. patent publication 2010-0007531, which was previously cited in this respect. An electrical connection to sensor elements described in this way can be easily implemented by a person skilled in the art.

In another embodiment disclosed herein, provision is made for the transparent window for each opening in the operator control panel to be formed by a transparent part in each case. These transparent parts are therefore inserted individually into each opening in the operator control panel and fastened to or in the operator control panel, for example by permanent adhesive bonding or mechanical connection by clips or the like. In this case, the transparent parts are advantageously flush with the surface of the operator control panel. It is possible to allow the illumination source to project into the opening in the operator control panel to a point just in front of the window or even right up against the window or in direct contact with the window. In this case, it is also possible to fasten the transparent parts to the illumination source or to the component support and then to insert them together with the illumination source or component support into the opening in the operator control panel.

In an alternative refinement of the invention, provision can be made for a plurality of windows to be formed in a coherent manner for plurality of openings. The windows can then be, for example, a light guide component or a light guide, with a light guide or a light-guiding connection advantageously not necessarily being provided between a plurality of windows, even if this is possible in principle. Provision can be made, for example, for a single such light guide component to be provided in the operator control panel for a coherent illuminated display, that is to say, for example, an abovementioned seven segment display, or the openings in the illuminated display. This allows more rapid assembly of the operator control device than with a large number of individual windows, as was described previously.

The coherent windows are advantageously inserted from the rear face of the operator control panel and fastened to the operator control panel and have projections or form projections which extend into the openings in the form of windows. These coherent windows should also close the openings, advantageously flush with the surface on the front face. The coherent component or light guide component can be connected at its rear face to the component support. The component support can advantageously be permanently adhesively bonded to the light guide component. The light guide component can also be permanently adhesively bonded to the rear face of the panel in order to be fastened, for example by bearing over a large surface area of the rear face of the operator control panel by way of regions between the windows or openings. Adhesive bonding can be performed, for example, using a double-sided adhesive film.

On the one hand, provision can firstly be made for windows, in particular when they are intended to be inserted into the openings separately, to be flat and to be arranged at some distance from the illumination means. As an alternative, in particular in the case of an above-described coherent light guide component for a plurality of coherent windows, rear-facing recesses can be provided in the windows, in particular beneath the projections of the light guide component, which projections extend into the openings, in the form of windows into which the illumination means engage or project. As a result, targeted emission of light is possible. Furthermore, the component support can bear against the rear face of the light guide component by way of its front face and be fastened by adhesive bonding or the like. As a result, it is also advantageously possible to delimit or separate the light paths of the illumination means from one another. This can be done, for example, by the light guide component being produced with a multi-component injection molding process using transparent material, in particular in the form of an abovementioned window, over the illumination source and opaque material around the illumination source, in particular for providing shielding from adjacent windows.

In a refinement of the invention, it is possible to likewise arrange the illumination source on the rear face of the component support with an illumination direction which does not pass directly to the operator control panel. In this case, the illumination source can emit light into an abovementioned light guide component, which deflects the direction of light at least once toward the opening in the operator control panel. Therefore, it is possible for the printed circuit board to be designed and populated more easily and a structure which is more compact overall is possible.

In this embodiment, the light guide component can deflect the light from the illumination source, which are in the form, in particular, of laterally illuminating LEDs or what are known as side LEDs with an illumination direction approximately parallel to the surface of the component support, once through approximately 90° toward the opening in the operator control panel. When normal LEDs are used, the light can be deflected twice in such a way that it runs toward the opening in the operator control panel again. The light guide component can in this case have projections, which extend into the openings and form the abovementioned windows.

The operator control device is advantageously closed at the rear by a housing. The above-described light guide component can be fastened to, for example, by injection-molded it on to the housing. Therefore, fewer individual components have to be fitted. Multi-component injection molding is also suitable.

The light guide component can be designed for a plurality of illumination sources and in this case have a dedicated reflection surface for each illumination sources. Optical separation between adjacent illumination sources to prevent light cross-radiating from one illumination means to an adjacent illumination sources, or at least reduced cross-radiation, can be achieved by shaping of the reflection surfaces. Therefore, optical separation between various illumination sources can be achieved, this being advantageous, for example, in the case of a bar-type display or an illuminated strip, as is known, for example, from U.S. Pat. No. 7,525,063 A1. As an alternative, slight cross-illumination may also be desirable for, as it were, display with soft lighting.

In a yet further embodiment of the invention, it is possible for a window or the entire light guide component to be at least partially in the form of a diffuser and/or a color filter, possibly only on the surfaces thereof. This therefore means that a more uniform illumination source or illuminated display can be provided. Furthermore, a colored design is possible. If a coherent light guide component is provided, these properties can, under certain circumstances, be provided only in the projections or windows, which engage in the openings in the operator control panel. This is the case when, for example, the surface or light outlet side of the windows is formed as a diffuser by roughening. As an alternative, particularly in the case of a multi-component injection molding process for a light guide component, the same material is used as far as possible in each case, for the sake of simplicity.

The illumination sources can advantageously be LEDs or surface mount device ("SMD") LEDs, for example the mentioned laterally radiating side LEDs. Other suitable light sources can be used. The illumination sources allow a compact arrangement on account of their small overall size.

These and further features can be gathered not only from the claims but also from the description and the drawings, wherein the individual features can be realized in each case by themselves or as a plurality in the form of subcombinations in an embodiment of the invention and in other fields and can constitute advantageous and inherently protectable embodiments for which protection is claimed here. The subdivision of the application into individual sections and sub-headings does not restrict the validity of the statements made thereunder.

BRIEF DESCRIPTION OF THE DRAWINGS

Exemplary embodiments of the invention are schematically illustrated in the drawings and will be explained in greater detail in the text which follows. In the drawings.

DETAILED DESCRIPTION OF THE EXEMPLARY EMBODIMENTS

Figures 1, 2:
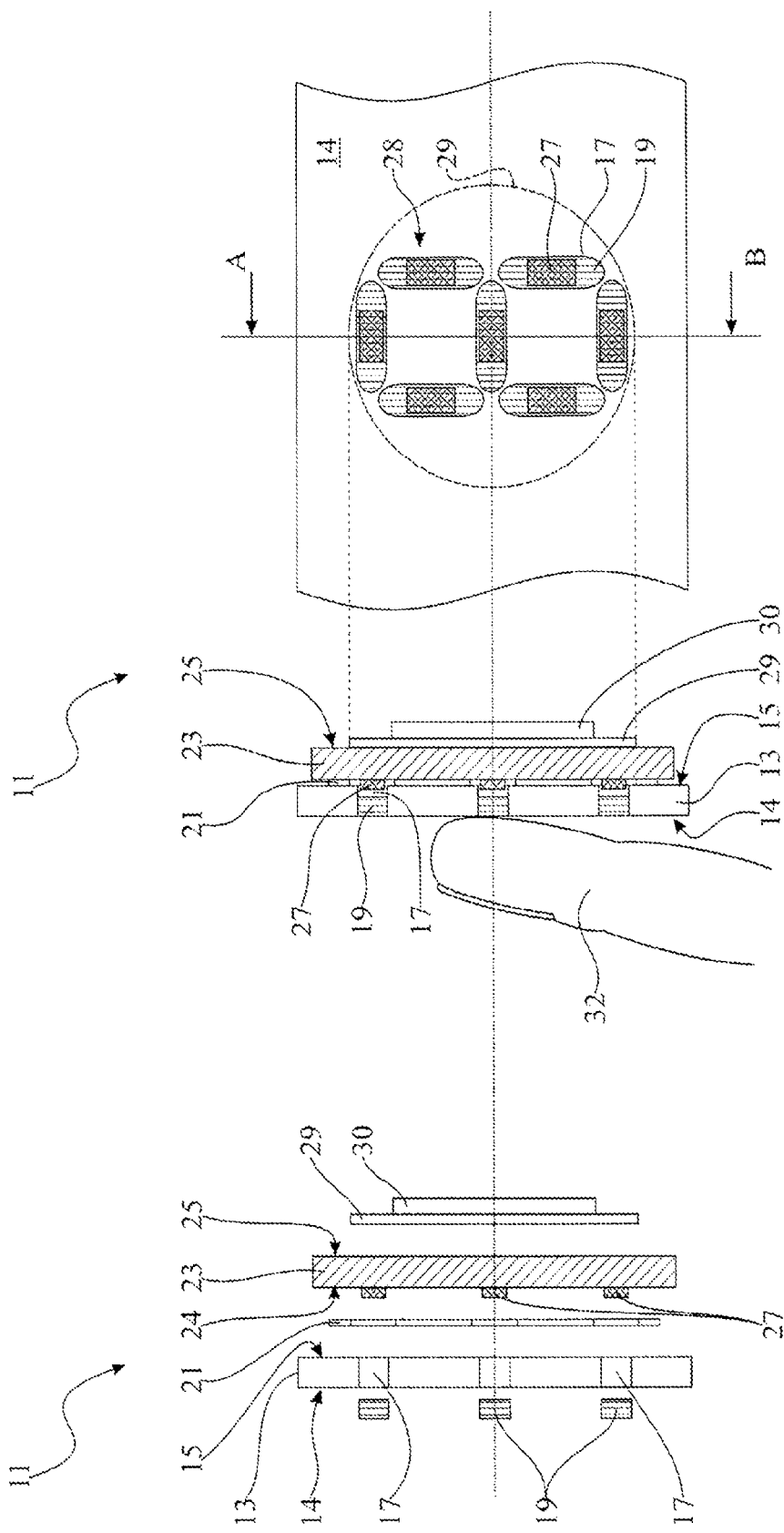
FIG. 1 shows an exploded illustration of a first embodiment of an operator control device according to the invention.
FIG. 2 shows the operator control device from FIG. 1 in the assembled state in a sectional illustration and also in a plan view of the front face.

FIG. 1 illustrates an exploded illustration of a first embodiment of an operator control device 11, which is also referred to herein as an "operating unit." The operator control device 11 has an operator control panel 13 which can be on a front face of an extractor hood or of another appliance from among the group of appliances that are known in the industry as "white goods." This means that the operator control panel 13 can be inserted into a housing of the electrical appliance approximately in the illustrated size or height. As an alternative, it can be an entire housing region of the electrical appliance.

The operator control panel 13 has a front face 14 and a rear face 15. A plurality of openings 17 are provided, windows 19 being inserted into the openings.

An adhesive film 21, which is adhesive on both sides and has recesses, which correspond to the openings 17, is applied to the rear face 15 of the operator control panel 13. A printed circuit board 23 in the form of an above-described component support is in turn mounted on the adhesive film in such a way that it bears against the adhesive film 21, and therefore bears against the rear face 15 of the operator control panel 13, by way of its front face 24.

The printed circuit board 23 has LEDs 27, which are advantageously SMD LEDs. The LEDs extend, as is clear from FIG. 2 in the assembled state, into the openings 17 in the operator control panel 13, but only to a point just in front of the windows 19. In this case, the windows 19 are flush with the surface of the front face 14 of the operator control panel 13. In this case, the windows 19 can be adhesively bonded into the openings 17, for example, in a manner which is known in the art using adhesives or the like, in order to be fastened.

A sensor support 29 with a sensor element 30 is mounted, advantageously once again adhesively bonded, on a rear face 25 of the printed circuit board 23. The sensor element 30 is in the form of a piezo sensor element which is known in principle, and reference being made, for example, to U.S. patent publication 2010-0007531 by the same applicant for the precise design of the piezo sensor element. An electrical contact-connection to the sensor element 30 is not illustrated, but can be easily implemented by a person skilled in the art.

FIG. 2 shows how an operator can apply a finger 32 to the front face 14 of the operator control panel 13 and, in the process, can exert a slight pressure. This pressure deforms both the operator control panel 13 and the printed circuit board 23 which is permanently adhesively bonded to it, and therefore also the sensor support 29 together with the sensor element 30. This can also be established and evaluated as an operator control operation, for example according to the above-described U.S. patent publication 2010-0007531.

The plan view of the operator control device 11 on the right-hand side of FIG. 2 shows that all the openings 17 and windows 19 in the operator control panel 13 of the illuminated display 28, which is a seven segment display, lie within the area of the sensor support 29. This is a highly suitable arrangement for registering the pressure applied by a finger 32 and a corresponding deformation.

In this way, an operator control device 11 can be provided, which operator control device has an illuminated display 28, which serves simultaneously as a touch switch and a corresponding sensor element 30 behind the touch switch. Very simple operator control is possible by an operator pressing the symbol or the illuminated display 28 using a finger 32. In a manner, which is not illustrated, but can be easily imagined by a person skilled in the art, further illuminated displays or operator control elements may be provided relatively close to the illuminated display 28, advantageously with basically the same structure, for example at a distance which corresponds approximately to the diameter of the illuminated display itself, possibly even less.

Figure 3:
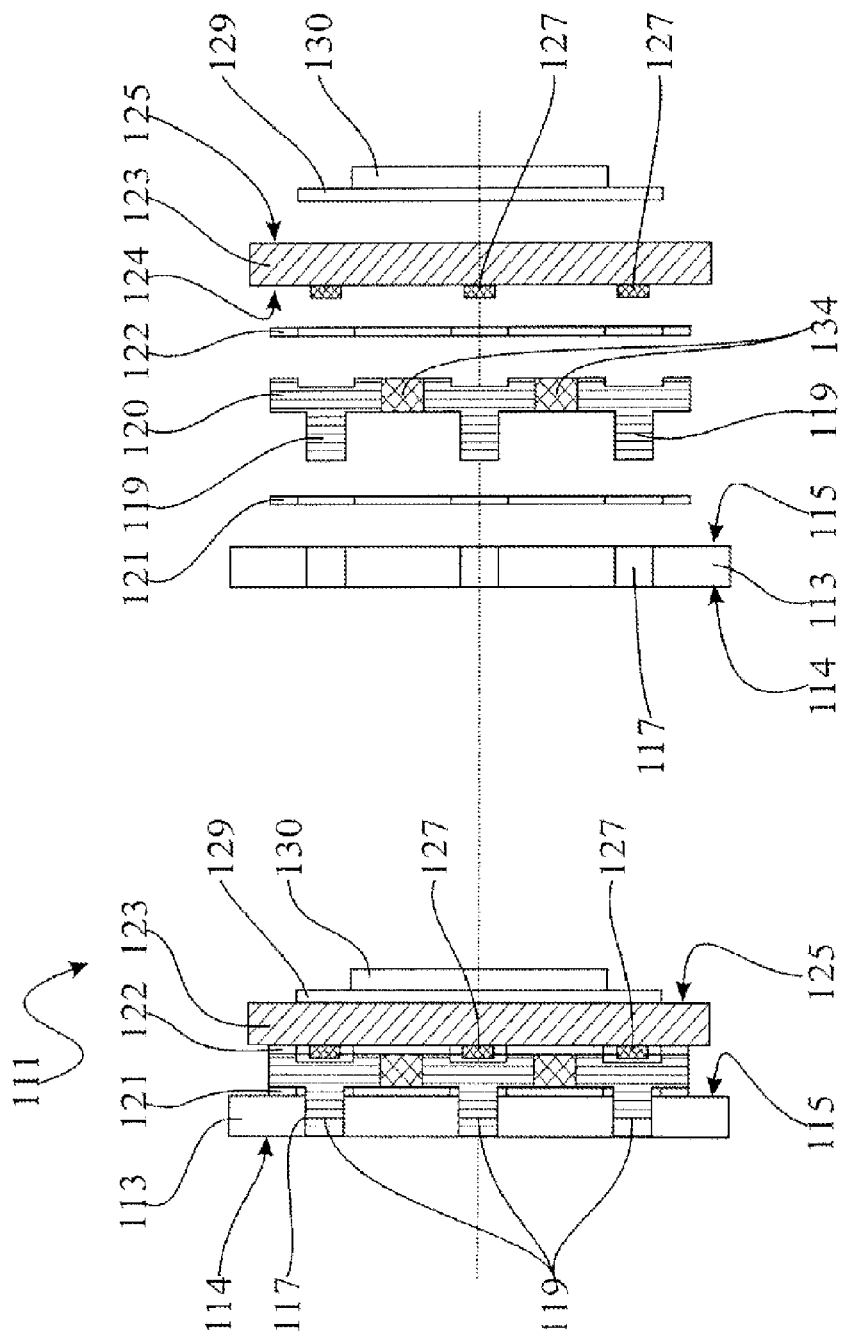
FIG. 3 shows a modified operator control device which is similar to that from FIG. 1 using similar illustrations.

FIG. 3 illustrates a modification to an operator control device 111, specifically in the assembled state on the left-hand side and in the form of an exploded illustration on the right-hand side. The operator control device 111 has an operator control panel 113, which is identical to that in FIGS. 1 and 2 and has a front face 114, a rear face 115 and openings 117 therein. Windows 119 are formed as projections of a light guide component 120, which connects all the windows 119 to one another, or has all the windows. A printed circuit board 123, which is identical to that in FIGS. 1 and 2 and has LEDs 127 on a front face 124 bears against a rear face of the light guide component 120 by means of a further double-sided adhesive film 122. In this case, the LEDs 127 engage in corresponding recesses on the rear face of the light guide component 120, specifically opposite the windows 119.

The light guide component 120 has separating regions 134 between the individual windows 119. The separating regions are opaque or are composed of opaque material which is produced in one working process with transparent material of the other light guide component 120, in particular at the windows 119, in a multi-component injection molding process. The separating regions 134 prevent an LED 127 from cross-radiating light from beneath one window 119 to another window 119 and therefore illuminating this area. This prevention of cross-radiation of light is achieved in FIG. 2 by the LEDs 27 also projecting some way into the openings 17 and therefore being surrounded both by the operator control panel 13 and by the adhesive film 21.

A sensor support 129 with the sensor element 130 on a rear face 125 of the printed circuit board 123 is once again formed in the same way as in FIGS. 1 and 2 and therefore does not need to be explained in any greater detail.

The main difference in FIG. 3 compared to FIGS. 1 and 2 is therefore the design of the windows 119 on a coherent component, specifically the light guide component 120. This allows simpler assembly of the operator control device 111 since only a single part has to be inserted into the openings 17, rather than seven windows 19, as is the case in FIG. 2. However, the coherent design of the light guide component 120 also primarily provides a precisely defined position of the windows 119 in the openings 117 by abutment against the rear face 115 of the operator control panel 113 together with the adhesive film 121.

Figure 4:
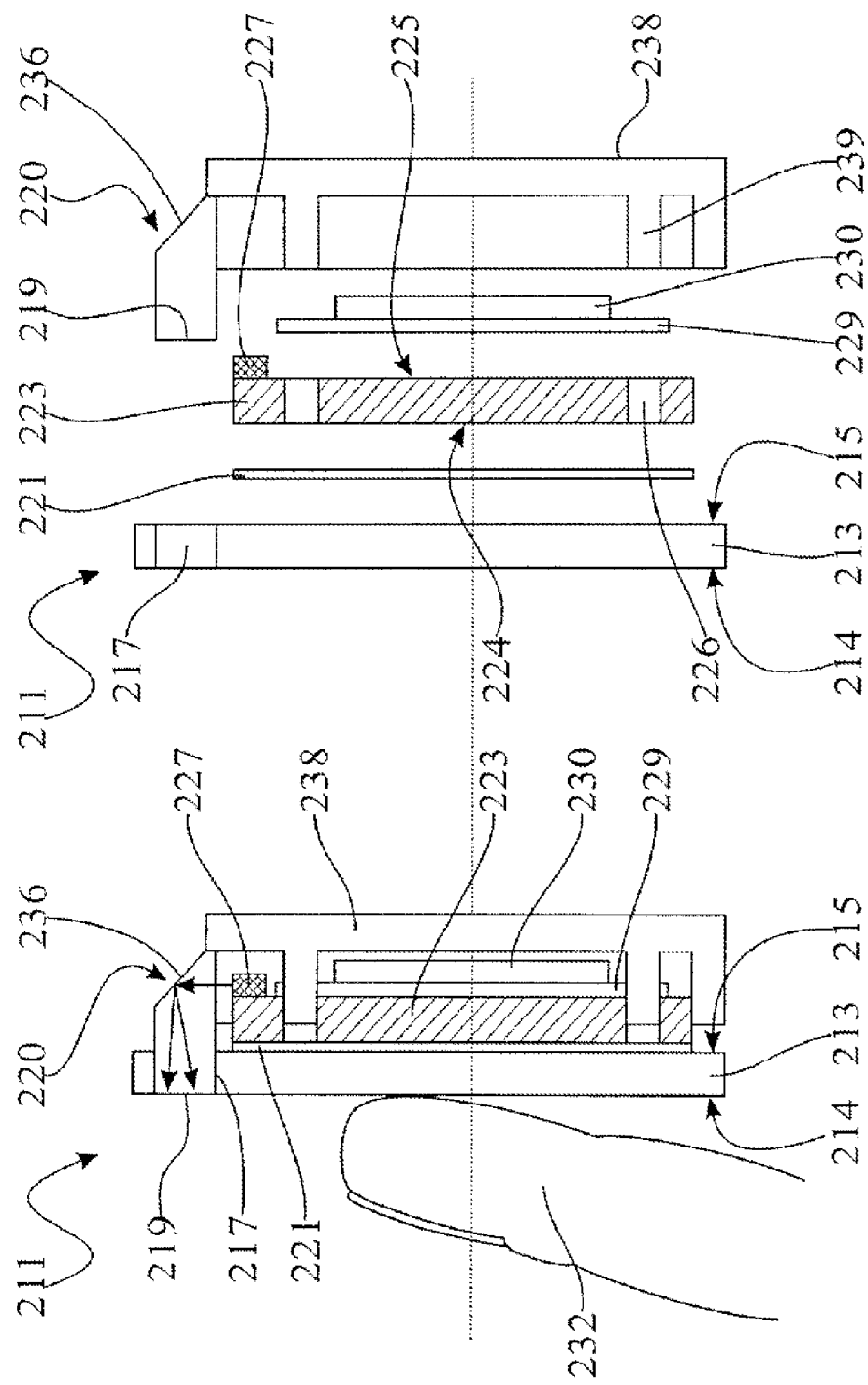
FIG. 4 shows an operator control device, which has been, modified further using similar illustrations to those in FIG. 3.

In the yet further modification of an operator control device 211 according to FIG. 4, an operator control panel 213 is again provided, where it is possible, for example, for the operator control panel to be composed of metal or stainless steel in this case. The left-hand side of the figure illustrates how a finger 232 is applied to the front face 214 of the operator control panel 213 for the contact switch. The functional units, which will be described below, are provided on a rear face 215.

A printed circuit board 223 is adhesively bonded, specifically by way of its front face 224, by means of an adhesive film 221. The printed circuit board is fitted with a plurality of LEDs 227 on its rear face 225. The LEDs are in the form of what are known as side LEDs, that is to say they emit light laterally as is illustrated by the arrows, and not perpendicularly from the fastening plane of the printed circuit board 223. The LEDs 227 emit light upward; this will be explained in greater detail further below.

A sensor support 229 with a sensor element 230 is likewise fastened on the rear face 225, as explained above specifically in the form of a piezo sensor element. A housing 238 is finally mounted and fastened, for example by pins 239 of the housing 238 engaging in holes 226 in the printed circuit board 223 and latching or clamping at this point in a customary manner.

Openings 217 in the operator control panel 213 are closed by windows 219, similarly to the manner, which has been described above, particularly in FIG. 3. However, the windows 219 are not individual parts, but rather hang on a kind of light guide component, in this case the housing 238, or are integrally produced with the housing. The windows 219 have a rear reflection surface 236 which causes the light which is emitted laterally or upward by the LEDs 227 to be reflected through approximately 90° and therefore to be output from the operator control panel 213 in the direction approximately perpendicular to the front face 214 of the operator control panel 213. In this case, the entire housing 238 can be formed from a light-guiding material, and therefore it can be produced in a simple manner. As an alternative, a window 219 in the form of a light guide component 220 comprising a corresponding plastic can be injection-molded onto a housing 238 which is composed of opaque plastic.

An advantage for the design according to FIG. 4 is achieved when, as has been described above, a plurality of sensor elements 230 are provided next to one another, advantageously in a line, on a relatively large operator control panel. In this case, a window 219 is located above each sensor element and can provide a display by means of an optical signaling operation, for example operation of the sensor element 230, by a finger 232 being applied. In this way, elongate operator control devices with touch switches can be effectively and advantageously combined with a corresponding optical display, for example even in metal operator control panels.

Therefore, it is also possible, for example, to arrange the LEDs 227 on the same side of the printed circuit board 223 as the sensor elements. This allows improved and simpler construction. Optical separation between adjacent illumination elements can be provided by shaping of the reflection surfaces 236 when a large number of windows 219 hang integrally next to one another, as it were, in the case of FIG. 4 in the plane of the drawing. The housing 238 can generally simultaneously serve as a mount for the printed circuit board, as a light guide and also as a contact-prevention means for the electronic elements which may further be provided on the printed circuit board 223, during mounting or during assembly.

The invention claimed is:

1. An operator control device for an electrical appliance comprising:

an operator control panel having at least one opening;
an illuminated display;
a contact switch;
a planar, pressure-sensitive sensor element; and
a transparent window being inserted into the at least one opening of the operator control panel and being flush with a front face of the operator control panel,
wherein the planar, pressure-sensitive sensor element is arranged opposite the at least one opening, wherein a flat component support is provided and arranged on a rear face of the operator control panel, the flat component support having at least one illumination source on one face and at least the planar, pressure-sensitive sensor element on a rear face opposite from the operator control panel.

2. The operator control device as claimed in claim 1, wherein a plurality of the openings are provided in the operator control panel, the openings forming a symbol.

3. The operator control device as claimed in claim 1, wherein the at least one illumination source is arranged behind the at least one opening in the operator control panel, such that the at least one illumination source projects into the at least one opening.

4. The operator control device as claimed in claim 3, wherein the at least one illumination source is arranged to project a distance into the at least one opening.

5. The operator control device as claimed in claim 1, wherein at least one opening in the operator control panel is one of associated with the planar, pressure-sensitive sensor element or is situated opposite the planar, pressure-sensitive sensor element, with the at least one opening situated opposite a surface of the planar, pressure-sensitive sensor element.

6. The operator control device as claimed in claim 5, wherein the operator control panel has at least two or more openings forming a coherent symbol of the illuminated display and all the at least two or more openings of the coherent symbol are situated opposite a surface of the planar, pressure-sensitive sensor element.

7. The operator control device as claimed in claim 1, wherein the planar, pressure-sensitive sensor element is a coating having a planar form on the flat component support.

8. The operator control device as claimed in claim 1, wherein the planar, pressure-sensitive sensor element is composed of piezo material.

9. The operator control device as claimed in claim 1, wherein the planar, pressure-sensitive sensor element is a separate component applied to the flat component support.

10. The operator control device as claimed in claim 1, wherein the transparent window in the at least one opening in the operator control panel comprises a respective transparent part located in the at least one opening in the operator control panel and fastened to the operator control panel.

11. The operator control device as claimed in claim 10, wherein the at least one illumination source projects the at least one opening in the operator control panel to one of a point immediately in front of the transparent window or in contact with the transparent window.

12. The operator control device as claimed in claim 1, wherein a plurality of the transparent windows are formed in a coherent manner for a plurality of openings in the operator control panel as a light guide component fastened to the operator control panel from the rear face of the operator control panel with projections of the light guide component extending into the plurality of openings.

13. The operator control device as claimed in claim 12, wherein the flat component support is provided on the rear face of the light guide component.

14. The operator control device as claimed in claim 12, wherein the light guide component is attached to the rear face of the operator control panel, wherein the flat component support is fastened to the rear face of the light guide component.

15. The operator control device as claimed in claim 12, wherein the at least one illumination source is arranged on the flat component support to one of engage with or extend into corresponding recesses in one of the plurality of transparent windows or in the light guide component.

16. The operator control device as claimed in claim 12, wherein the at least one illumination source is arranged on the rear face of the flat component support with an illumination direction which does not pass directly to the operator control panel, with the at least one illumination source emitting light into the light guide component that is configured to deflect the direction of the light at least once toward the opening in the operator control panel.

17. The operator control device as claimed in claim 16, wherein the light guide component is configured to deflect the light from the at least one illumination source once through approximately 90° toward the opening in the operator control panel.

18. The operator control device as claimed in claim 17, wherein the at least one illumination source comprises a laterally illuminating LED with an illumination direction parallel to the surface of the component support.

19. The operator control device as claimed in claim 16, wherein the operator control device is enclosed at its rear by a housing, with the light guide component fastened to the housing.

20. The operator control device as claimed in claim 16, wherein the light guide component is designed for a plurality of the illumination sources and is provided with one reflection surface for each one of the plurality of the illumination sources, with an optical separation provided between adjacent illumination sources to prevent light radiating from one illumination source to an adjacent illumination source, the optical separation achieved by shaping of the one reflection surface.

21. The operator control device as claimed in claim 1, wherein the windows are at least partially in a form of diffusers or color filters.

22. The operator control device as claimed in claim 11, wherein the windows are at least partially in a form of diffusers or color filters in a region of their projections that engage in the openings in the operator control panel with the light guide.

* * * * *

UNITED STATES PATENT AND TRADEMARK OFFICE
CERTIFICATE OF CORRECTION

PATENT NO.           : 8,922,979 B2
APPLICATION NO.      : 13/336689
DATED                : December 30, 2014
INVENTOR(S)          : Henry Fluhrer et al.

Page 1 of 1

It is certified that error appears in the above-identified patent and that said Letters Patent is hereby corrected as shown below:

On the Title Page, the name of the Assignee:

--(73) Assignee "E.G.O. Elektro-Geratebau GmbH" Should read --E.G.O. Elektro-Gerätebau GmbH--

On the Title Page, please add:

--(30) Foreign Application Priority Data: Jul. 9, 2009   (DE) DE 102009033538.2--

Signed and Sealed this
Twenty-fourth Day of November, 2015

Michelle K. Lee
*Director of the United States Patent and Trademark Office*